United States Patent
Fang et al.

(10) Patent No.: US 11,083,076 B1
(45) Date of Patent: Aug. 3, 2021

(54) ANTI-VIBRATION AND HEAT DISSIPATION STRUCTURE FOR MEMORY SOCKET

(71) Applicant: ADLINK TECHNOLOGY INC., New Taipei (TW)

(72) Inventors: Chih-Liang Fang, New Taipei (TW); Cheng-Chun Cheng, New Taipei (TW)

(73) Assignee: Adlink Technology Inc., New Taipei (TW)

( * ) Notice: Subject to any disclaimer, the term of this patent is extended or adjusted under 35 U.S.C. 154(b) by 38 days.

(21) Appl. No.: 16/742,328

(22) Filed: Jan. 14, 2020

(51) Int. Cl.
| | | |
|---|---|---|
| *H05K 1/02* | (2006.01) | |
| *H05K 1/18* | (2006.01) | |
| *H01R 12/73* | (2011.01) | |
| *H01R 13/533* | (2006.01) | |
| *H01R 12/72* | (2011.01) | |

(52) U.S. Cl.
CPC ......... *H05K 1/0203* (2013.01); *H01R 12/721* (2013.01); *H01R 12/73* (2013.01); *H01R 13/533* (2013.01); *H05K 1/181* (2013.01); *H05K 2201/10159* (2013.01); *H05K 2201/10325* (2013.01); *H05K 2201/2045* (2013.01)

(58) Field of Classification Search
CPC ................. H05K 1/0203; H05K 1/181; H05K 2201/10325; H05K 2201/2045; H05K 2201/10159; H01R 12/73; H01R 13/533; H01R 12/721
See application file for complete search history.

(56) References Cited

U.S. PATENT DOCUMENTS

| | | | |
|---|---|---|---|
| 2010/0309624 A1* | 12/2010 | Yeh | ........................... G06F 1/20 361/679.48 |
| 2016/0278198 A1* | 9/2016 | Matsumoto | ......... H01L 23/3672 |
| 2017/0367175 A1* | 12/2017 | Lai | ..................... H05K 7/20445 |
| 2019/0230780 A1* | 7/2019 | Matsumoto | ............ H05K 1/181 |

\* cited by examiner

*Primary Examiner* — Hung S. Bui
*Assistant Examiner* — Sagar Shrestha
(74) *Attorney, Agent, or Firm* — Muncy, Geissler, Olds & Lowe, P.C.

(57) ABSTRACT

An anti-vibration and heat dissipation structure for a memory socket includes a circuit board, a heat dissipation pad, and a heat dissipation shell. The circuit board includes memory sockets for insertions of memory modules. The heat dissipation pads are disposed on upper and lower surfaces of memory modules, respectively, to upwardly conduct heat, generated by the memory modules to the topmost heat dissipation pad via a stack structure of the memory modules and the heat dissipation pads. The heat dissipation shell comprises a maintenance window, and a cover board disposed on the maintenance window and having a bottom surface abutted with the topmost heat dissipation pad, to form a vertical position-limiting and anti-vibration structure to conduct heat to the heat dissipation shell via the cover board for dissipation, and easy maintenance of the memory modules via the maintenance window is also achieved.

6 Claims, 4 Drawing Sheets

ANTI-VIBRATION AND HEAT DISSIPATION STRUCTURE FOR MEMORY SOCKET

BACKGROUND OF THE INVENTION

1. Field of the Invention

The present invention provides an anti-vibration and heat dissipation structure for a memory socket, and more particularly to a structure capable of conducting heat, generated by memory modules, to a heat dissipation shell via a cover board for heat dissipation, and facilitating easy maintenance of the memory modules via a maintenance window.

2. Description of the Related Art

With rapid development of electronic technology, various types of computer equipment such as personal computers (PCs), notebook computers or tablet computers are applied in many application fields, are designed is a tendency towards strong computing power and light weight. Furthermore, with open architecture of computer equipment and the standardization of software and hardware, and continuous expansion and upgrade of functions, industrial computers suitable for various industries have developed maturely. The main applications of the industrial computers include industrial control/automation equipment, networking and communication equipment, image detection and recognition, and intelligent transportation systems. Furthermore, the industrial computers can also be used in higher-level applications requiring high reliability and stability, such as military, transportation and aerospace fields; in order to execute various high-efficient operations in severe environment of the higher-level applications, the industrial computers must meet relevant specific specifications and requirements.

Various types of industrial computers include single board computers (SBC), computer on module (COM), and back plane module (BPM). For example, the computer on module is equipped with a heat source device (CPU), a chipset, an input/output port (I/O port), and a built-in power supply; the computer on module can be used to integrate all system interfaces and functions by driving memory modules and hard disk drives, so as to provide a plug-and-play (PNP) hardware platform and an additional function expansion socket. Because of having a smaller size than that of motherboard of a personal computer, the computer on module has higher usage flexibility in a variety of fixed and mobile embedded systems and industrial applications. However, due to the small size and fast operating speed, the computer on module accumulates more heat than general motherboard. Therefore, a good heat dissipation structure is needed for the computer on module.

A general small outline dual in-line memory module (SO-DIMM) socket is often used in industrial or military computer having limited space; furthermore, such industrial or military computers have severer requirement in anti-vibration and heat dissipation in operational environment, compared with general computers. Therefore, how to develop an anti-vibration and heat dissipation structure which is suitable for the SO-DIMM socket and also supports easy maintenance for memory module failure, is a key issue in industries.

SUMMARY OF THE INVENTION

In order to solve the conventional problems, the inventors develop an anti-vibration and heat dissipation structure for a memory socket according to collected data, multiple tests and modifications, and years of research experience.

An objective of the present invention is to provide an anti-vibration and heat dissipation structure for a memory socket, and the anti-vibration and heat dissipation structure includes a circuit board, a plurality of heat dissipation pads, and a heat dissipation shell. The circuit board includes a plurality of memory sockets disposed on a surface thereof, and configured for insertions of a plurality of memory modules. The plurality of memory sockets are in a stack structure. The plurality of heat dissipation pads are disposed on upper and lower surfaces of the memory modules, respectively, and configured to upwardly conduct heat, generated by the plurality of memory modules, to the topmost heat dissipation pad via a stack structure of the plurality of heat dissipation pads and the plurality of memory modules. The heat dissipation shell is assembled on the circuit board, and has a maintenance window formed thereon and correspondingly in position to the plurality of memory modules, and a cover board assembled thereon, correspondingly in position to the maintenance window and having a bottom surface abutted with the topmost heat dissipation pad, so as to form a vertical position-limiting and anti-vibration structure to conduct the heat, generated by the plurality of memory modules, to the heat dissipation shell via the cover board for heat dissipation; furthermore, the purpose of easy maintenance of the memory modules via the maintenance window can be achieved.

According to an embodiment, the cover board comprises two position-limiting hanging arms extended downwardly from two opposite sides thereof and abutted and positioned with outer sides of swing arms on the two opposite sides of the plurality of memory sockets, so as to form a horizontal position-limiting structure of the plurality of memory modules, the heat-generating chip and the plurality of heat dissipation pads.

According to an embodiment, the heat dissipation shell comprises at least one fastening groove recessed on peripheral of the maintenance window and having at least one fastening hole formed thereon, and the fastening groove is configured to position a fastening lug plate of the cover board, the fastening lug plate comprises at least one through hole formed thereon, so that a fastener is inserted into the at least one through hole and fastened in the fastening hole of the fastening groove, to form a fastening structure of the cover board and the heat dissipation shell.

According to an embodiment, the plurality of memory sockets disposed on the circuit board are in an inclined stack structure.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
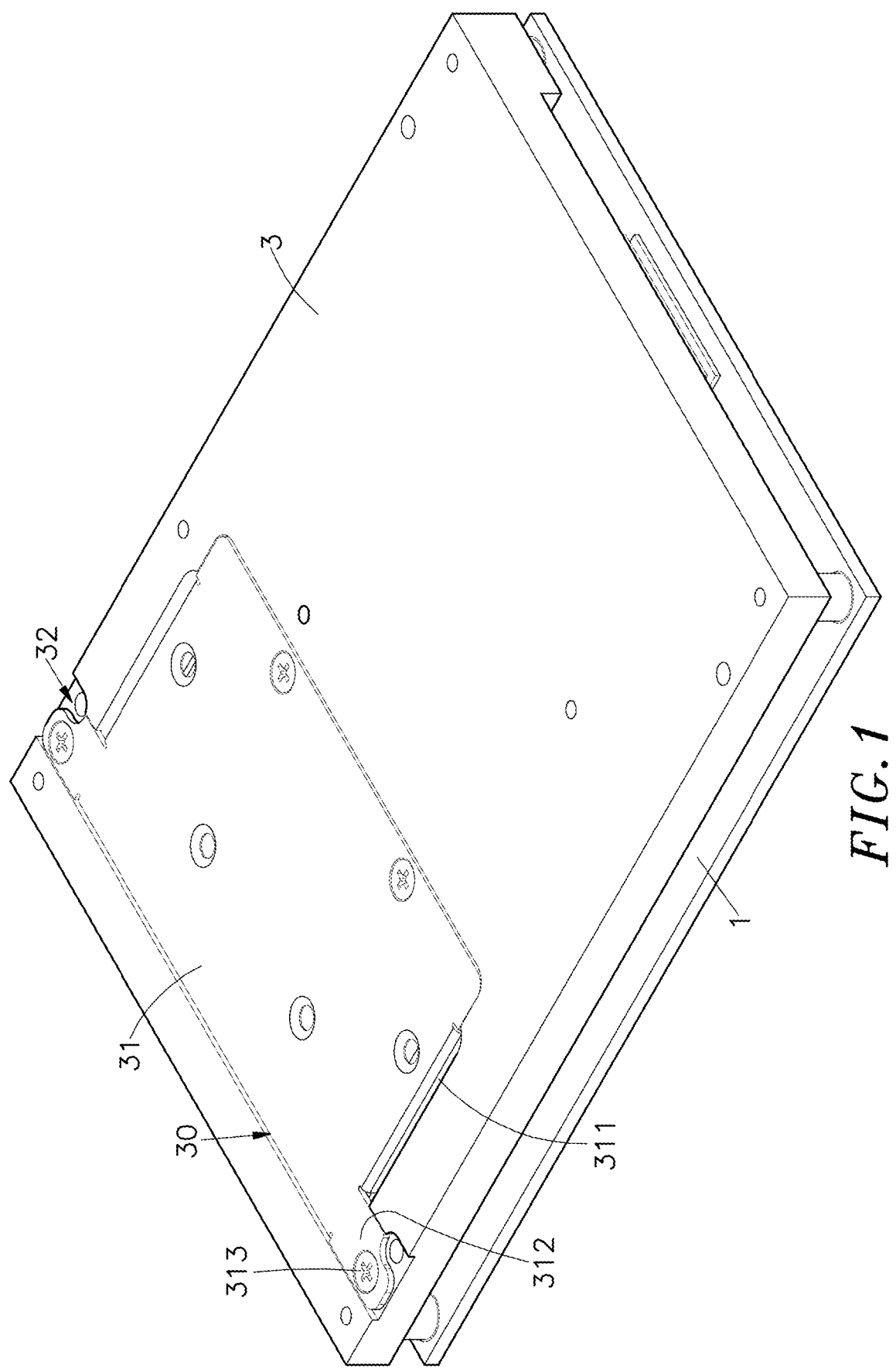
FIG. 1 is a perspective view of an anti-vibration and heat dissipation structure for a memory socket, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present.

In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Figure 2:
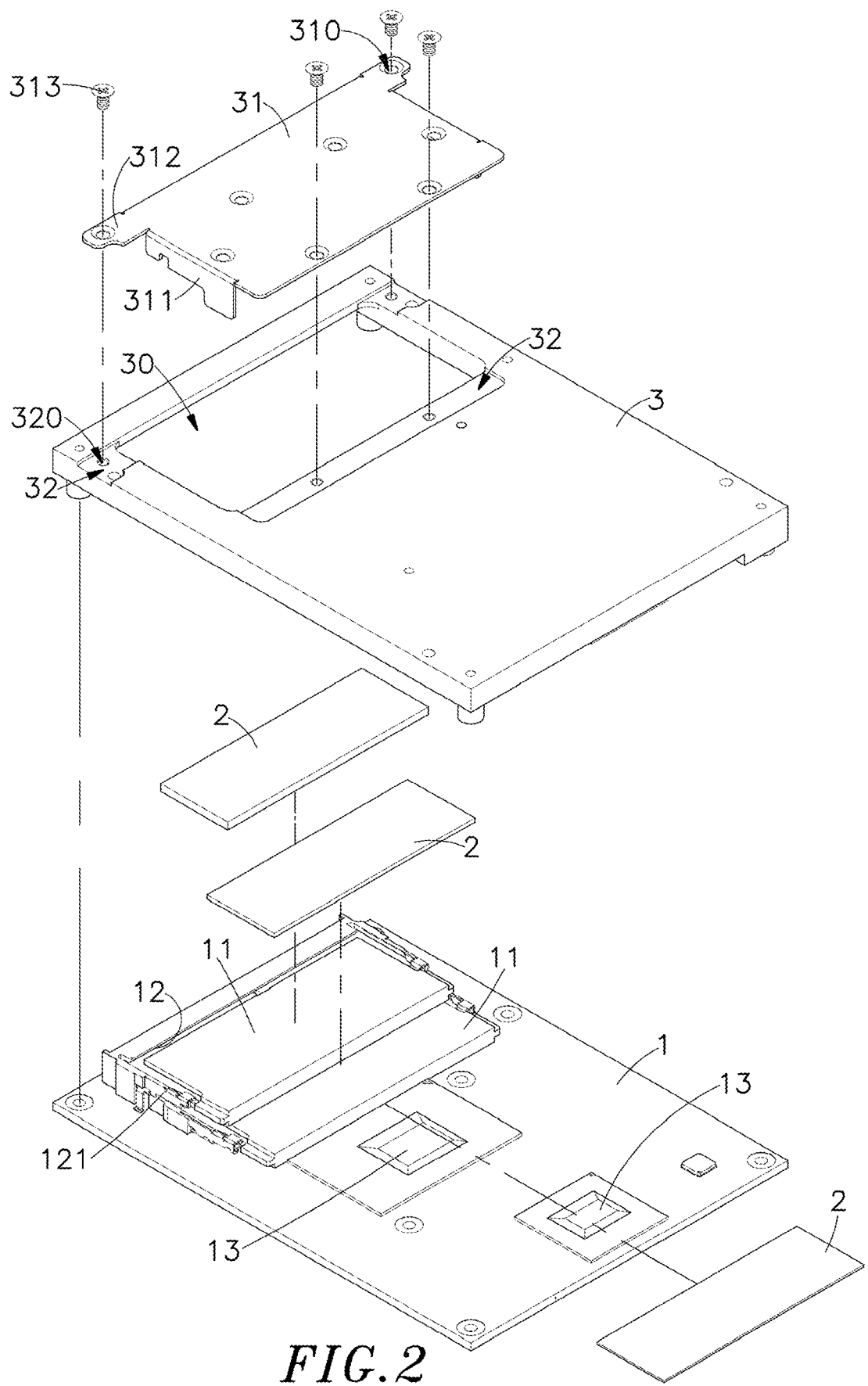
FIG. 2 is a perspective exploded structural diagram of an anti-vibration and heat dissipation structure for a memory socket, according to the present invention.
Figure 3:
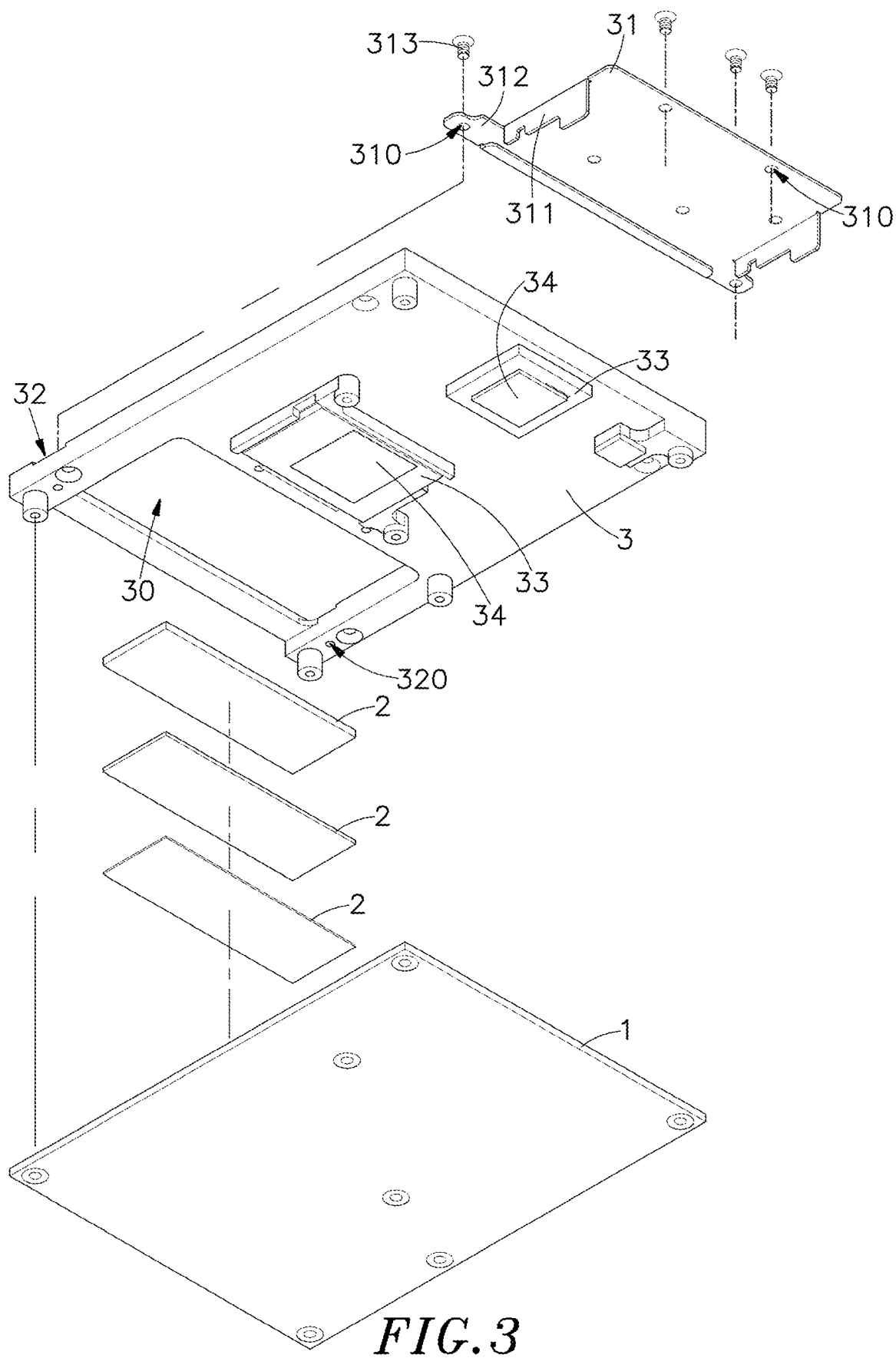
FIG. 3 is an another perspective exploded structural diagram of an anti-vibration and heat dissipation structure for a memory socket, according to the present invention.
Figure 4:
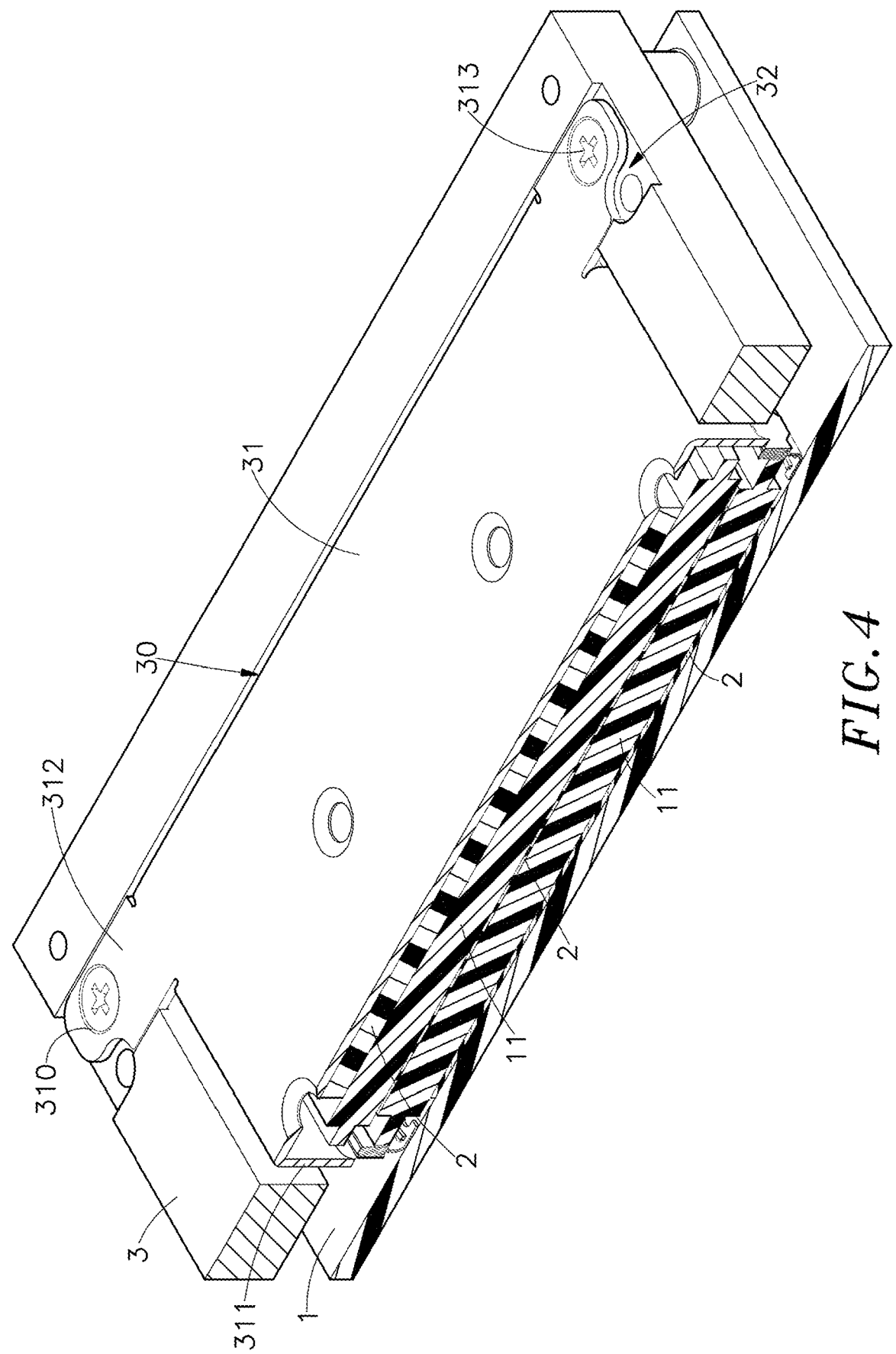
FIG. 4 is a 3D cross-sectional structural diagram of an anti-vibration and heat dissipation structure for the memory socket, according to the present invention.

Please refer to FIGS. 1 to 4, which are a perspective view, a perspective exploded structural diagram, another perspective exploded structural diagrams and a 3D cross-sectional structural diagram of an anti-vibration and heat dissipation structure for a memory socket according to the present invention. As shown in FIGS. 1 to 4, the anti-vibration and heat dissipation structure comprises a circuit board 1, a heat dissipation pad 2, and a heat dissipation shell 3, and structures of the components and connection relationship between the components will be illustrated in following paragraphs in detail.

The circuit board 1 comprises a plurality of memory sockets 12 disposed on a surface thereof and configured for insertions of a plurality of memory modules 11. In an embodiment, the memory sockets 12 can be arranged in a stack structure, and the memory module 11 can be a small outline dual in-line memory module. Furthermore, the circuit board 1 comprises at least one heat-generating chip 13 disposed on a sides of the plurality of memory sockets 12.

The memory sockets 12 disposed on the circuit board 1 are in inclined stack structures.

The heat dissipation pads 2 are disposed on upper surfaces of the plurality of memory modules 11 and the heat-generating chip 13. The heat, generated by the memory modules 11, can be upwardly conducted via the heat dissipation pads 2 and a stack structure formed by the memory modules 11 and the heat dissipation pads 2, to the topmost heat dissipation pad 2. In an embodiment, the heat dissipation pad 2 can be made by material with cushion and shock-absorbing function.

The heat dissipation shell 3 is assembled on the circuit board 1, and has a maintenance window 30 formed thereon and correspondingly in position to the plurality of memory modules 11, and a cover board 31 assembled thereon and correspondingly in position to the maintenance window 30 and having a bottom surface abutted with the topmost heat dissipation pad 2, so as to form a vertical position-limiting and anti-vibration structure which can conduct heat generated by the memory modules 11, to the heat dissipation shell 3 via the cover board 31 for heat dissipation.

The cover board 31 has two position-limiting hanging arms 311 extended downwardly from two opposite sides of, respectively, and abutted with and positioned on outer sides of swing arms 121 of the two opposite sides of the plurality of memory sockets 12, so as to form a horizontal position-limiting structure for the plurality of memory modules 11 and the plurality of heat dissipation pads 2.

The heat dissipation shell 3 comprises at least one fastening groove 32 recessed on peripheral of the maintenance window 30, each of the at least one fastening groove 32 has at least one fastening hole 320 formed thereon, and the fastening groove 32 is configured to position a fastening lug plate 312 of the cover board 31, and the fastening lug plate 312 comprises at least one through hole 310 formed thereon, and a fastener 313 can be inserted through the through hole 310 and fastened in the fastening hole 320 of the fastening groove 32, so as to form a fastening structure of the cover board 31 and the heat dissipation shell 3.

The heat dissipation shell 3 comprises a thermal conduction device 33 disposed on a bottom thereof and correspondingly in position to the heat-generating chip 13. In an embodiment, the thermal conduction device 33 can be made by metal block which conducts heat easily, and the thermal conduction device 33 can comprise thermal putty 34 or phase change material disposed on a surface thereof and abutted with a top of the heat-generating chip 13, so as to form a thermal conduction and anti-vibration structure between the heat-generating chip 13 and the heat dissipation shell 3.

In order to assemble and use the above-mentioned anti-vibration and heat dissipation structure for the memory socket, the plurality of heat dissipation pads 2 are pasted with the plurality of upper and lower surfaces of the memory modules 11, respectively, and the plurality of memory modules 1 are then inserted into the memory sockets 12 on the circuit board 1, respectively. The swing arms 121 on two opposite sides of each of the memory sockets 12 are pressed down to rotate to a horizontal state from a vertical state, so as to form a fastening structure of the memory modules 11 and the memory sockets 12. In this case, the upper surfaces of the plurality of memory modules 11 form a stepped structure upwardly obliquely extended, and the heat dissipation pad 2 on the lowermost memory module 11 is tightly attached with the lower surface of the above adjacent memory module 11, so that this structure can fill gaps between the plurality of memory modules 11, to form the structure of tightly conducting heat, thereby upwardly conducting heat generated by the plurality of memory modules 11, via the heat dissipation pads 2 and the stack structure of the memory modules 11 and the heat dissipation pads 2, to the topmost heat dissipation pad 2; the heat dissipation shell 3 is assemble above the circuit board 1, the bottom surface of the cover board 31 of the heat dissipation shell 3 is abutted with the topmost heat dissipation pad 2 to form the vertical position-limiting and anti-vibration structure, so as to conduct heat, generated by the memory modules 11 to the heat dissipation shell 3 via the cover board 31 for heat dissipation; the two position-limiting hanging arms 311 of the cover board 31 can be abutted with and positioned in the outer sides of the two swing arms 121 of the plurality of memory sockets 12, so that the horizontal position-limiting structure for the memory modules 11 and the heat dissipation pads 2 can be formed, and the purpose of easy maintenance of the memory modules 11 via the maintenance window 30 of the heat dissipation shell 3 can be achieved. For the heat-generating chip 13 disposed on the circuit board 1, the thermal conduction device 33 on the bottom surface of the heat dissipation shell 3 and the thermal putty 34 or the phase change material abutted with a top of the heat-generating chip 13 can be used form the thermal conduction and anti-vibration structure between the heat-generating chip 13 and the heat dissipation shell 3.

As shown in FIGS. 1 to 4, the anti-vibration and heat dissipation structure for the memory socket mainly includes the circuit board, the heat dissipation pads, and the heat dissipation shell; the circuit board comprises the memory sockets disposed on the surface thereof and configured for insertions of the memory modules; the heat dissipation pads are disposed on the upper and lower surfaces of the memory modules and configured to upwardly conduct heat, generated by the memory modules, via the heat dissipation pads and the stack structure formed by the memory modules and the heat dissipation pads, to the topmost heat dissipation pad; the heat dissipation shell comprises the maintenance window, and the cover board disposed on the maintenance window and having the bottom surface abutted with the topmost heat dissipation pad, so as to form the vertical position-limiting and anti-vibration structure for conducting heat, generated by the memory modules, to the heat dissipation shell via the cover board for heat dissipation, and also achieve the purpose of easy maintenance of the memory modules via the maintenance window. As a result, the anti-vibration and heat dissipation structure of the present invention has high practicability in the field of the industrial computer or military computer.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An anti-vibration and heat dissipation structure for a memory socket, comprising: a circuit board comprising a plurality of memory sockets disposed on a surface thereof, and configured for insertions of a plurality of memory modules, wherein the plurality of memory sockets are in a stack structure; a plurality of heat dissipation pads disposed on upper and lower surfaces of the plurality of memory modules, respectively, and configured to upwardly conduct heat, generated by the plurality of memory modules, to the topmost heat dissipation pad via a stack structure of the plurality of heat dissipation pads and the plurality of memory modules; and a heat dissipation shell assembled on the circuit board, and having a maintenance window formed thereon and correspondingly in position to the plurality of memory modules, and a cover board assembled thereon, correspondingly in position to the maintenance window and having a bottom surface abutted with the topmost heat dissipation pad, so as to form a vertical position-limiting and anti-vibration structure to conduct the heat, generated by the plurality of memory modules, to the heat dissipation shell via the cover board for heat dissipation, wherein the heat dissipation shell comprises at least one fastening groove recessed on peripheral of the maintenance window and having at least one fastening hole formed thereon, and the fastening groove is configured to position a fastening lug plate of the cover board, the fastening lug plate comprises at least one through hole formed thereon, so that a fastener is inserted into the at least one through hole and fastened in the fastening hole of the fastening groove, to form a fastening structure of the cover board and the heat dissipation shell.

2. The anti-vibration and heat dissipation structure according to claim 1, wherein the cover board comprises two position-limiting hanging arms extended downwardly from two opposite sides thereof and abutted and positioned with outer sides of swing arms on the two opposite sides of the plurality of memory sockets, so as to form a horizontal position-limiting structure of the plurality of memory modules, a heat-generating chip and the plurality of heat dissipation pads.

3. The anti-vibration and heat dissipation structure according to claim 1, wherein the circuit board comprises at least one heat-generating chip disposed on sides of the plurality of memory sockets.

4. The anti-vibration and heat dissipation structure according to claim 3, wherein a heat dissipation shell comprises a thermal conduction device disposed on a bottom thereof and correspondingly in position to the heat-generating chip, the thermal conduction device comprises thermal putty or phase change material disposed on a surface thereof and abutted with a top of the heat-generating chip, so as to form a thermal conduction and anti-vibration structure between the heat-generating chip and the heat dissipation shell.

5. The anti-vibration and heat dissipation structure according to claim 1, wherein the memory module is a small outline dual in-line memory module.

6. The anti-vibration and heat dissipation structure according to claim 1, wherein the plurality of memory sockets disposed on the circuit board are in an inclined stack structure.

* * * * *